US009837599B1

(12) United States Patent
Reeves et al.

(10) Patent No.: US 9,837,599 B1
(45) Date of Patent: Dec. 5, 2017

(54) FILMS AND THE LIKE PRODUCED FROM PARTICLES BY PROCESSING WITH ELECTRON BEAMS, AND A METHOD FOR PRODUCTION THEREOF

(71) Applicants: Ryan D. Reeves, Melbourne, FL (US); Thomas M. Lasko, Merritt Island, FL (US); Justin J. Hill, Merritt Island, FL (US)

(72) Inventors: Ryan D. Reeves, Melbourne, FL (US); Thomas M. Lasko, Merritt Island, FL (US); Justin J. Hill, Merritt Island, FL (US)

(73) Assignee: Mainstream Engineering Corporation, Rockledge, FL (US)

( * ) Notice: Subject to any disclaimer, the term of this patent is extended or adjusted under 35 U.S.C. 154(b) by 0 days.

(21) Appl. No.: 15/621,348

(22) Filed: Jun. 13, 2017

Related U.S. Application Data

(62) Division of application No. 15/189,694, filed on Jun. 22, 2016.

(51) Int. Cl.

| | |
|---|---|
| ***H01L 31/036*** | (2006.01) |
| ***H01L 21/00*** | (2006.01) |
| ***H01L 41/273*** | (2013.01) |
| ***H01L 21/477*** | (2006.01) |

(52) U.S. Cl.
CPC .......... *H01L 41/273* (2013.01); *H01L 21/477* (2013.01)

(58) Field of Classification Search
CPC ............................ H01L 21/477; H01L 41/273
USPC ....... 438/550, 660, 795–798; 257/51, 64, 75
See application file for complete search history.

(56) References Cited

U.S. PATENT DOCUMENTS

| | | | | |
|---|---|---|---|---|
| 2,394,072 | A | 2/1946 | Westendorp | |
| 3,145,436 | A * | 8/1964 | Hanks | C22B 9/228 164/469 |
| 4,189,686 | A * | 2/1980 | Brau | H01S 3/0903 372/2 |
| 9,156,058 | B2 * | 10/2015 | Brandl | B22F 3/1055 428/408 |
| 9,328,976 | B1 * | 5/2016 | Lasko | F28F 21/08 |
| 2016/0233358 | A1 * | 8/2016 | Carroll | C01G 19/006 31/326 |

OTHER PUBLICATIONS

Stolle, C. Jackson, Richard D. Schaller, and Brian A. Korgel. "Efficient carrier multiplication in colloidal CuInSe2 nanocrystals." Journal of Physical Chemistry Letters 5.18 (2014): 3169-3174.

* cited by examiner

*Primary Examiner* — Calvin Lee

(57) ABSTRACT

An article composed of sintered particles is produced by depositing ligand-containing particles on a substrate, then scanning the substrate with an electron beam that generates sufficient surface and subsurface heating to substantially eliminate the ligands and melt or sinter the particles into a cohesive film with superior charge carrier properties. The particles are sintered or melted together to form a polycrystalline layer that is substantially ligand-free to form, for example, a film such as a continuous polycrystalline film. The scanning operation is conducted so as to heat treat a controllably localized region at and below a surface of the particles by selecting a rate of deposited energy at the region to exceed a rate of conduction away from the substrate.

6 Claims, 5 Drawing Sheets

FILMS AND THE LIKE PRODUCED FROM PARTICLES BY PROCESSING WITH ELECTRON BEAMS, AND A METHOD FOR PRODUCTION THEREOF

CROSS-REFERENCE TO RELATED APPLICATION

This application is a Division of U.S. patent application Ser. No. 15/189,694, filed Jun. 22, 2016, being issued, which is related to U.S. patent application Ser. No. 13/865,889, filed Apr. 13, 2013, now U.S. Pat. No. 9,328,976, issued May 3, 2018, the subject matter of which is incorporated herein by reference.

BACKGROUND AND SUMMARY OF THE INVENTION

The present invention is a method for sintering and/or melting particles such as nano-, micro- or quantum dot particles to form a continuous film using electron beams (Ebeams). These Ebeams may be produced through ordinary, non-accelerated electron beams, normal conducting linear accelerator (LINAC) Ebeam systems or through superconducting linear accelerator (scLINAC) Ebeam systems. scLINACs are discussed below as an exemplary case with added benefits above other systems (i.e. rate and process depth). Particularly, the present invention is concerned with a process for fabricating bodies such as thin films composed of semiconducting powders or inks used as photovoltaic or other optoelectrical devices. These materials may include, but are not limited to, silicon, germanium, cadmium selenide, cadmium telluride, copper indium gallium selenide (CIGS), copper indium selenide (CIS), copper sulfide, copper zinc tin sulfide (CZTS), lead sulfide, and lead selenide among others familiar to those of ordinary skill in the art. The materials may be in micro- or nanoparticle form.

The present invention is capable of overcoming many of the hurdles associated with thermal annealing, photonic curing, or laser sintering of semiconductor films. Unlike lasers, Ebeams are transparent to plasma and are capable of homogeneous heating, X-ray dosing, and electric field generation at the surface and the subsurface of a material to a predetermined depth. When laser processing power is increased, plasma is generated, reflecting the laser and resulting in spotty, unprocessed regions. The higher energy and power of Ebeams far exceeds laser and photonic curing, allowing faster processing and heating speeds. Faster processing speeds and higher energy reduces costs by allowing for more rapid production. This is especially important for photovoltaic technology since cost per kW is the largest prohibitive feature for widespread implementation of this technology.

In order for photovoltaic (PV) devices to generate energy competitively on a cost basis with carbon-based fuels, bodies such as PV films must become more efficient and/or cheaper. Much effort has been dedicated to achieving higher power conversion efficiencies, often at the expense of more complicated and expensive materials. Another route is to pursue low-cost manufacturing methods for PV production. In particular, this means foregoing traditional epitaxial and other non-scalable and costly fabrication methods for low-cost solution processing. For example, powders or inks composed of micro- and nanocrystalline semiconductors can be tape cast, direct-write, printed, painted, or spray-cast on substrates in established low-cost, high-volume industrials processes. The advantage of these powders or inks is that they can then be deposited on flexible substrates for use in conformal photovoltaic or optoelectrical devices which may be integrated into many applications such as wearable electronics.

The as-deposited films are, however, often very poor conductors of charge as the individual semiconductor particles are electronically isolated from one another by surface ligands required for solution suspension. The particles suspended in the ink require surfactants to prevent aggregation and precipitation from the solution prior to deposition. The surfactant molecule can be electrically conductive or semiconductive, causing shorting across the film, but is usually electrically insolating, increasing film series resistance. To produce a cohesive and electrically-connected film without shorting, the as-deposited particles are exposed to energy, typically in the form of heat or light, to destroy the ligand and sinter the particles together into a polycrystalline film. These approaches include photonic curing, rapid thermal annealing, and laser sintering. In all cases, the energy is converted to heat in the crystal which destroys or volatilizes the surfactant groups and sinters the particles together into a cohesive film.

This electrically-converted heat is not localized to the inter-particle interface, however, and is typically conducted to the entire device structure. Even in the case of localized laser sintering, the heat is conducted to the surrounding layers and to the underlying substrate. This can prevent flexible substrates, like polymers, from being used as they will melt and deform at temperatures much lower than the necessary sintering temperature of semiconductors. Furthermore, laser sintering creates plasma at the film surface which reflects the light and inhibits film heating. Thus the laser must scan at a slower speed and lower energy to ensure that enough heat is generated in the film, thereby increasing the processing time and leading to higher thermal spreading. This higher time characteristic associated with the laser scan speed means longer processing times, increased heat flux to the substrate, and even can cause ion migration in the crystal structure. In some cases, the energy required to destroy the ligand is prohibitively high such that photocuring is not possible due to extreme plasma generation and light reflection.

Stolle et al. [J. Phys. Chem. Lett., 2014, 5, 3169-3174] demonstrated that exposure to excessive photonic curing leads to decreased photovoltaic performance. The photonic curing process is very non-uniform at high power. The cause was not explained in that paper, but it is likely the result of plasma having been generated during the sintering process which caused the photons to be reflected from the surface. We recognized that Ebeam sintering would not have this problem as electrons are transparent to plasma and would not be reflected. In addition, laser sintering only heats the sample surface and relies on heat conduction for sub-surface heating. Ebeam processing would more rapidly heat the surface and sub-surface since the beam can penetrate through the material and impart energy. Rapid localized volumetric heating with Ebeams has the added benefit of lower cost through faster and out-of-vacuum processing. In addition, rapid local homogenous heat to the film can allow for processing on flexible polymer substrates to create wearable, low-cost electronic devices and solar cells.

The present invention is directed to a process that sinters semiconducting films through highly localized, rapid heating via Ebeam sintering and/or melting and to the products of that process. Specifically, ultra-high energy and power scLINAC-produced beams have been found to stand apart from existing methods in that these systems are capable of higher electron energy and power. Beam energy directly scales with process depth, which can be dramatically deeper with scLINACs. Beam power, which is at least 20× higher with scLINACs than any other system, scales with process speed (heating rate). High-energy Ebeams using a scLINAC are utilized to provide continuous electron beam exposure to the sample piece. The concept for Ebeam-LINACs was first introduced as the Betatron in the 1940's. See, e.g., U.S. Pat. No. 2,394,072. Only recently, however, have high-power Ebeam-scLINACs been recognized as a viable option for unique materials processing due to reductions in system size, power consumption and cost. The ability of the Ebeam-scLINAC to precisely deliver energy to a prescribed volume of material is unique, and we have discovered there are a substantial number of materials-processing operations now possible with its use as described in U.S. Pat. No. 9,328,976. As a way to succinctly illustrate the principles of the present invention and its advantages, the following discussion compares thermal material processing with Ebeam-scLINACs; specifically with respect to the production of CIGS films, and, more specifically, the production of solution-processible, flexible photovoltaic devices. Processing of thin films can be accomplished, however, with conventional conducting and scLINAC Ebeam systems alike. scLINAC-produced Ebeams will be discussed going forward only as an exemplary case.

Energy delivery to material via a scLINAC-produced Ebeam is both rapid and efficient with nearly 100% of the electron energy being imparted to the material. In contrast, conventional thermal processing by contact, convection or irradiation heating is slow, and a large amount of energy is lost to the surroundings or to heat up the instrument itself. These known methods do not allow for simultaneous heating of both the workpiece material's surface and subsurface without undesirably heating support or balance of device components, especially with any degree of control with respect to subsurface processed depth. Furthermore, laser irradiation often generates plasma that reflects light. Plasma is also generated with such Ebeam irradiation, but the electrons are transparent to plasma so that the thermal processing can continue uninhibited.

Electron beam heating produced with the scLINAC is optimal for rapid, selective, localized heating. The internal energy generation is localized to a region, and the size of the region depends on the beam parameters, including accelerating voltage and beam diameter, and the properties of the target material. Unlike resistive heating, the energy generation is not uniform and is limited to a region adjacent to the surface regardless of electrical conductivity. Electron beams so generated can deliver a large amount of thermal energy in a small region with efficiencies of greater than 90%, making it an optimal solution for the fast sintering of semiconducting films. Furthermore, most Ebeam systems operate in a pulsed capacity with on and off cycles to prevent the machine from overheating. However, the Ebeam-scLINAC operates continuously with a 100% duty cycle. As a result, has a power density at least twenty times higher.

The present invention has the advantage of being able to fabricate continuous polycrystalline films with improved electrical and thermal properties from powders or inks. Specifically, the powder beds or printed inks are sintered into a cohesive film through ultra-high energy/power electron beam sintering. Of specific interest are films of semiconducting materials. These materials may include, but are not limited to, silicon, germanium, cadmium selenide, cadmium telluride, CIS, CIGS, copper sulfide, CZTS, lead sulfide, and lead selenide among others familiar to those skilled in the art. These semiconducting films can replace expensive single-crystalline layers in photovoltaic devices, thermophotovoltaics, infrared detectors, focal plane arrays, and emitters in light-emitting diodes or lasers among others. Of course, it should be understood that the present invention is not limited to such films but may include other types of bodies and materials.

An object of our invention is to lower the manufacturing cost of products like single-crystalline semiconductor layers for photovoltaics and other optoelectrical devices. The solution processing of a semiconductor ink, in particular, can be integrated into existing printing lines well-known to those with knowledge in the art. Similar processing can be achieved with powders or slurries of semiconductor particles to form the films. Our high energy Ebeam processing approach may also be integrated into the roll-to-roll assembly line. The Ebeam-scLINAC would continuously raster the films sintering the printed or cast particles into a cohesive film and pass the films to the next step in the assembly line. This continuous assembly-line processing is a stark contrast to the epitaxial growth of single crystal films employed in many photovoltaic devices.

A further object of this invention is to improve the electrical conductivity, thermal conductivity, and charge transport of the semiconductor film. The untreated powder or ink contains surfactants and additives that prevent aggregation of particles and allow for uniform deposition. As above noted, these largely organic surfactants and additives are electrically insulating and inhibit charge transfer. Conductive or semiconductive surfactants would electrically short a device and usually need to be removed as well. Our high energy Ebeam processing approach removes the surfactant groups from the surface of the particles and sinters or melts the particles together to form physical contact. This type of processing dramatically increases the electrical and thermal properties of the cohesive film and improves the performance of the photovoltaic and optoelectrical device.

Another object of our invention is to reduce thermal spreading of the Ebeam processing by scanning the electron beam across the surface of the body. A small and controllably localized region at and below the surface is heat treated as the beam moves. The rate at which the energy is deposited exceeds the rate of conduction away from the region, allowing the semiconducting or other material at sufficient depth from the surface to remain below a critical temperature. The local heating allows the semiconducting film to be sintered directly on a flexible polymer substrate without actually melting the polymer. Active cooling of the substrate can also be used to maintain substrate temperatures below the polymer melting or softening temperature. The selective heating of the film is a unique feature of Ebeam-scLINAC processing of semiconductor powders or inks that provides alternatives in the choice of substrates to rigid metals or silicon wafers. For example, the ability to process there semiconductor films is advantageous for flexible optoelectronic devices for use in conformal applications, integration with textiles, and wearable electronics.

Still another object of this invention is to improve the processing speed of the film sintering process. Laser sintering or photonic curing can lead to plasma generation at the surface of the film which scatters much of the incoming energy before it can reach the sample. This means that either the laser power or the processing time or both must be increased to assure enough energy is transferred to the film for effective sintering. In some cases, photonic processing is not even possible due to the balance between the target temperature and plasma generation. This can lead to unsintered powders and/or incomplete breakdown of the ligand. Either result increases the series resistance of the device. While our Ebeam processing approach also generates plasma as the film surface, the electron beam is transparent to the plasma. Therefore nearly all of the Ebeam energy is transferred to the film. Furthermore, as above noted, Ebeam-scLINAC systems operate continuously with a 100% duty cycle and therefore are capable of faster rastering speeds as more energy is imparted to the film in a shorter amount of time compared to normal Ebeam processing.

The present invention thus dramatically improves on the known variations of producing semiconductor films and interlayers by allowing for low cost, solution processing of photovoltaic and other optoelectronic devices. The processing time is reduced by high energy Ebeam-scLINAC processing from faster rastering speeds, and the selective heat treatment is localized compared to lower energy Ebeam processing or laser sintering. The reduction in thermal spreading allows for the use flexible polymer substrates for conformal applications such as wearable electronics.

Other objects, advantages and novel features of the present invention will become apparent from the following detailed description when considered in conjunction with the accompanying drawings and non-limiting examples herein.

DETAILED DESCRIPTION OF THE DRAWINGS

Figure 1:
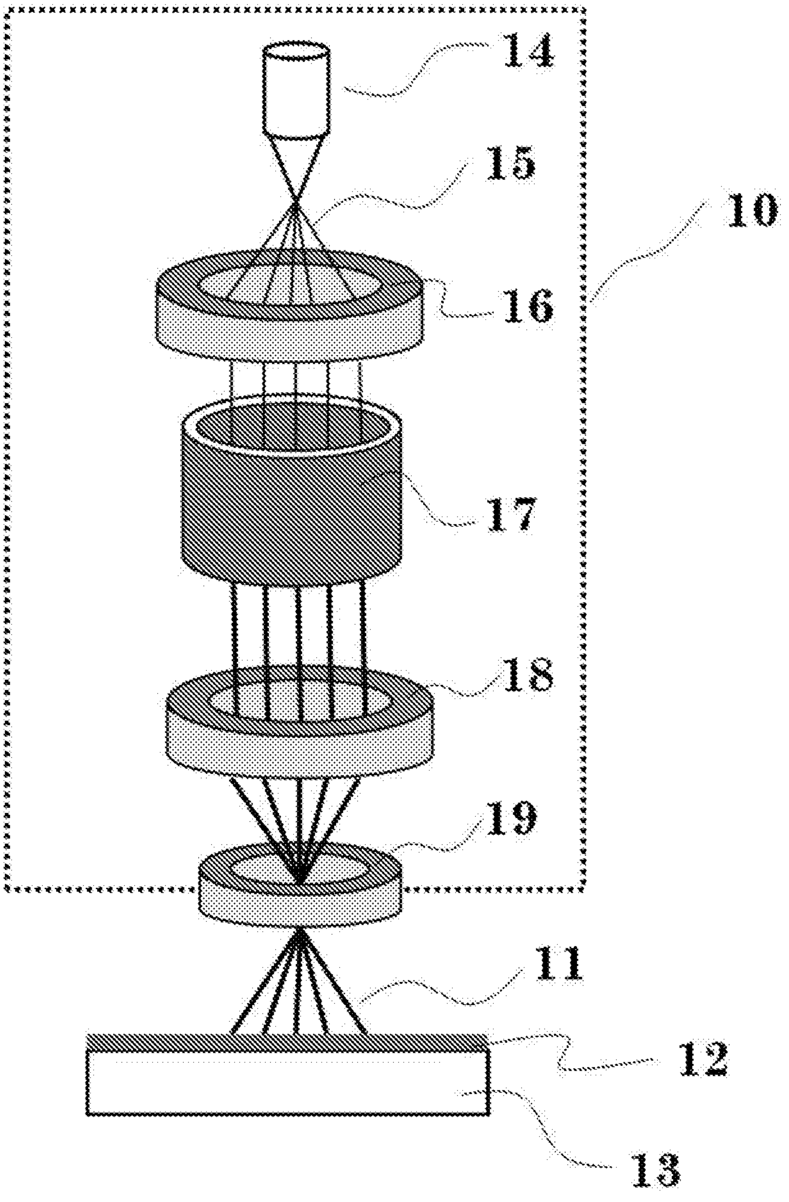
FIG. 1 is a general schematic of a conventional Ebeam-scLINAC used to accomplish materials processing in accordance with the present invention.

An Ebeam-scLINAC of conventional construction is shown in FIG. 1 in relation to a workpiece to be processed. The Ebeam-scLINAC system 10 is represented by the dotted line that encompasses all of the elements that compose the system. The Ebeam-scLINAC system emits high-energy electrons (>1 MeV) 11 at high continuous power output. The near-relativistic electrons 11 are directed to the workpiece which is composed of a film of material to be processed 12 on top of a substrate 13. The high-energy electron beam bombards the surface/subsurface of the film 12, thereby generating both heat and radiation from scattering events. The amount of heat that is generated generally depends on the beam current and the depth to which this heat is delivered below the surface depends on the accelerating voltage. Normal conducting LINACs or non-accelerated electron beams are generally lower in both average power and energy thus not able to heat as rapidly or as deeply. The substrate 13 can be actively cooled or temperature controlled to control the heat flux and temperature of across the film 12.

The Ebeam-scLINAC system itself 10 is composed of an electron gun 14 to generate and emit the low-energy electrons (<300 keV) 15. The low-energy electrons 15 are represented by the thin vertical lines. The electrons are accelerated and focused by the anode 16. Upon passing through the superconducting linear accelerator cavity 17, the electron beam is accelerated to a higher voltage dramatically leading to a high-energy electron beam 11 represented by the thick vertical lines. The beam current (power), which originates from the gun 14, is not diminished during acceleration because the accelerator cavity is superconducting. Otherwise, beam power would be reduced by at least 95%. The high-energy electron beam 11 then passes through several apertures and magnetic lenses 18 to collimate, focus and steer the beam. The lens 18 shown in FIG. 1 is a general representation, but in practice commercially available systems employ many apertures and magnetic lenses both before and after the scLINAC cavity 17. The electron beam 11 may then irradiate an in-vacuum sample platen or pass through an electron window 19 to process the sample or work-piece 12 outside of vacuum as is depicted in FIG. 1. As is well known and thus not needed to be illustrated, a vacuum pump and cryogenic cooling systems are also required to maintain vacuum and superconductivity within the Ebeam-scLINAC system (the area defined by dotted lines designated by numeral 10) to dissipate the heat load generated within the scLINAC 17. Using the magnetic lens 18 to spread and raster the electron beam 11 across the surface of the film 12 allows for a large area to be processed in a short time period. Alternatively, the substrate 13 and film 12 can be rastered in conjunction with or independent of the electron beam 11 to process different locations along the surface of the film 12. Especially at high accelerating voltages, the material subsurface processing depth of the film 12 can exceed several millimeters or more, depending on the atomic mass of the processed material.

Out-of-vacuum processing of films is unique to the scLINAC system. Ordinary electron beam systems or non-conducting LINAC systems process all materials under high vacuum as described in U.S. Pat. No. 3,145,436. Due to the high energy of the electron beam 11 generated using an Ebeam-scLINAC system 10, directly resulting in no loss in beam power, an electron window 19 can be used to process films or other materials outside of vacuum. The electron window 19 can be composed of a low atomic density material or plasma that holds vacuum on one side and a gaseous environment while being semi- or fully-permeable to electrons. Other types of electron beams require high vacuum as the electrons will scatter when interacting with gaseous molecules much more than the high energy and power scLINAC Ebeam. The high energy electron beam 11 sacrificially loses energy as it passes through the electron window 19 and the gaseous environment. However, the energy is sufficiently high that even with the losses, the electron beam is still able to process the workpiece 12. This allows the electron beam to be incorporated into direct-write systems and roll-to-roll manufacturing as the samples no longer need to be loaded into a high vacuum chamber. They can now be processed alongside traditional manufacturing equipment lines.

Furthermore, the high energy electron beam 11 emitted from Ebeam-scLINAC systems 10 can process materials and films 12 through flash melting. Ordinary electron beams heat the workpiece through bombardment which generates heat which is conducted to the surrounding area thereby creating a large melt pool. This occurs even if active cooling is applied to the substrate 13. High energy and power electron beams 11 impart so much energy in the form of heat to the workpiece that the material under the beam can instantaneously or flash melt without prolonged exposure to the electron beam, preheating of the material or film 12, or conduction of heat of surrounding areas. This means that the melt pool is localized to only the beam exposure, and therefore, the resolution of melting can be decreased substantially. In addition, non-equilibrium or far-from-equilibrium grain structures can be achieved by this rapid, localized heating as described by T. M. Lasko et al. in U.S. Pat. No. 9,328,976.

Figure 2:
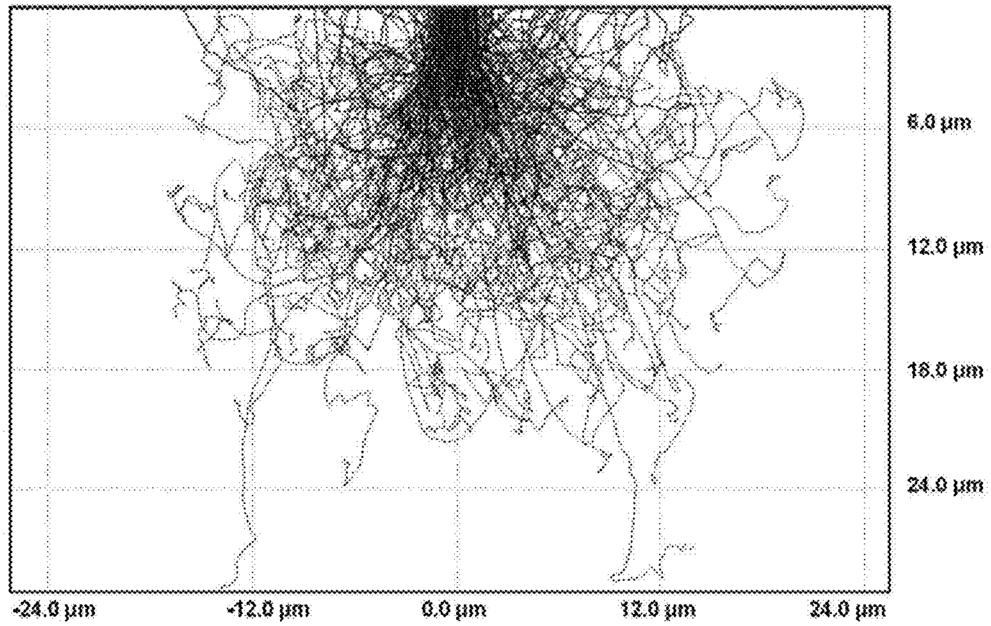
FIG. 2 is a computational plot of the electron trajectories in a copper indium selenide crystal.

FIG. 2 shows an exemplary simulation of trajectories from a 100 keV electron beam in a CIS substrate target. The simulation consists of 100,000 electron trajectories, only a portion of which are shown. The lines show trajectories of electrons as they are scattered while moving through the substrate. The electrons are injected from a 5 μm diameter beam at the interface of the vacuum or inert gas and the solid CIS substrate, indicated by 0 μm on the vertical axis. The vertical axis represents the penetration depth into the substrate from the surface, while the horizontal axis represents the distance the electrons travel perpendicular to the beam direction. The horizontal axis is centered on the beam axis and represents the spreading of the electron trajectories from the beam axis. The lines that terminate within the target indicate electrons that are absorbed into the crystal structure. The lines that terminate at the top edge show the trajectories of electrons that are backscattered and are ejected from the substrate. This simulation indicates that the approximate penetration depth of the electron beam at 100 keV is 30 μm.

Figure 3:
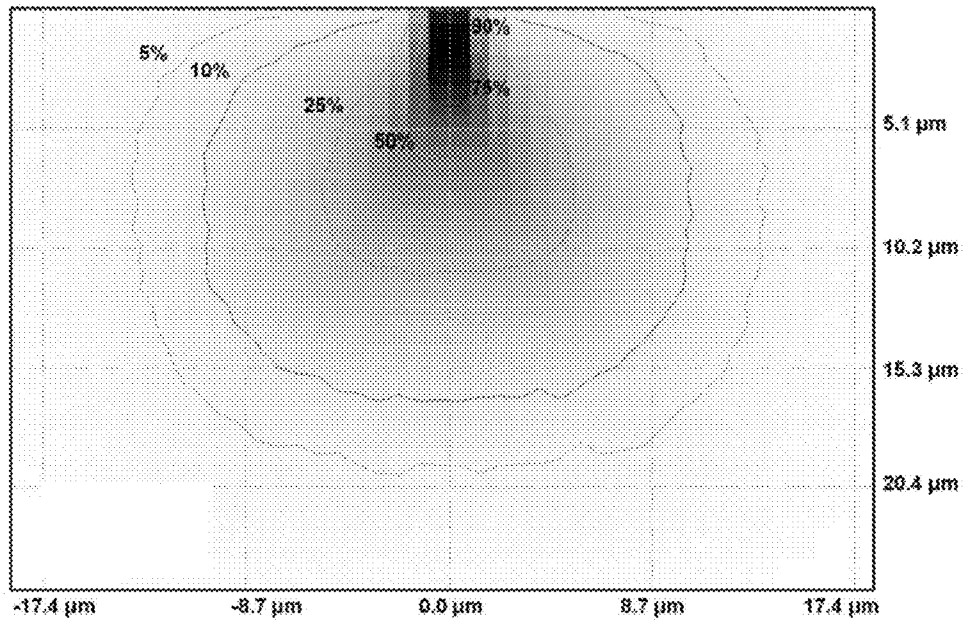
FIG. 3 is a computational plot of the energy deposition profile in a copper indium selenide crystal.

FIG. 3 shows the energy deposition profile for the simulation shown in FIG. 2. The innermost contour represents a region that is exposed to 90% of the total energy deposited by the beam. The outermost contour represents a region that is exposed to 5% of the total energy deposited by the beam. A Monte Carlo simulation of the trajectories can be used along with a thermal analysis to develop a profile of the energy deposited in the solid as a function of position. This profile is essentially a snapshot at a particular point in time for an electron beam. Coupling these results with the beam current and the scan rate provides an accurate description of the total amount of energy deposited in the sample over time for a given process. Unlike laser sintering of the film, the electron beam is transparent to plasma generated by the high thermal fluxes which translates to a desirably higher energy deposited in the sample.

Figure 4:
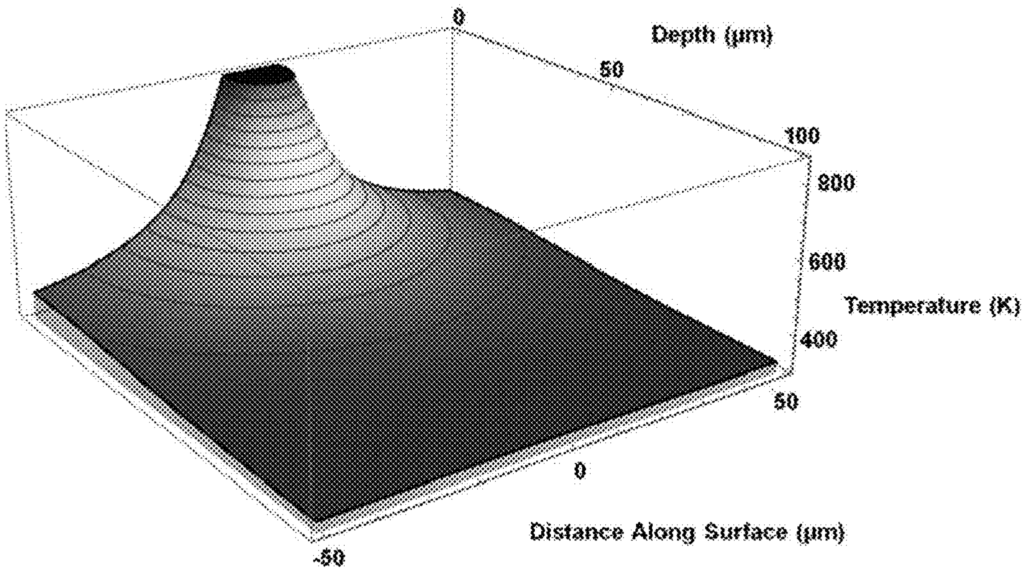
FIG. 4 is a computational plot of the temperature profile in a copper indium selenide film when irradiated by an electron beam.

FIG. 4 shows the modeled thermal profile of copper indium selenide when exposed to a 100 keV, 6 μA electron beam with a beam diameter of 5 μm. A one msec exposure time of the electron beam was used for the thermal model in FIG. 4. The x-axis of the plot in FIG. 4 represents the distance along the surface with respect to the centerline of the electron beam. The y-axis of the plot represents the penetration depth from the surface and the z-axis represents the modeled temperature using the Monte Carlo electron trajectories and energy distribution in FIGS. 2 and 3 respectively. Under these conditions listed, the region of melting for copper indium selenide should penetrate ~1 μm into the surface of the film with a ~1 μm diameter cross-section at the surface of the film. The expected area of sintering is 12 μm in diameter and 10 μm in depth. These results demonstrate the capability of electron beams to melt or sinter a film of nanoparticles. The parameters used are for exemplary purposes only and can be changed to optimize the processing conditions as necessary. While copper indium selenide was used for this example, other materials can be used known to those of ordinary skill in the art.

Figure 5:
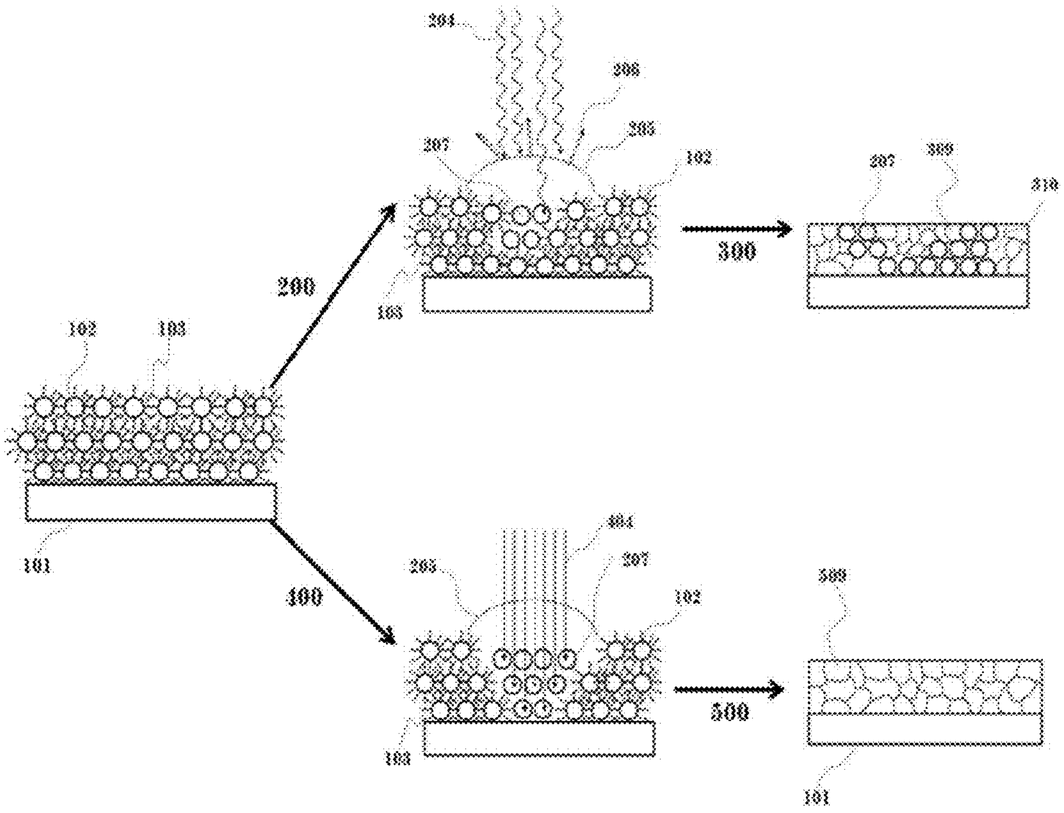
FIG. 5 is a schematic representation of the comparison of photon and electron beams in processing the deposited semiconductor layer at different steps in the sintering process of the present invention.

FIG. 5 schematically illustrates the difference in the interaction of a sample processed, on one hand, via laser sintering (200) and, on the other hand, via scLINAC-produced electron beam sintering or melting (400) where the same numerals are used to designate corresponding features. Here, the sample for processing is composed of a substrate 101 with deposited powder or inks of semiconducting nanoparticles 102. First the untreated nanoparticle powders or inks 102 are deposited onto the substrate 101. This can be done by knife coating, doctor blading, inkjet printing, spray casting or drop casting among others familiar to one of ordinary skill in the art. Typically, these powders or inks 102 contain additives or ligands 103 to stabilize the nanoparticles prior to deposition. That is, nanoparticles suspensions require ligands to prevent aggregation of particles in solution. Powders also often contain additives to prevent clumping during processing. While necessary for uniform deposition of thin films, these additives or ligands 103 can have adverse effects on the overall film properties including decreased electrical and thermal conductivity, insulating bandgaps, and reduced mechanical strength of the film. It should be understood that the substrate material 101 may vary depending on the application and can include semiconducting wafers such as silicon, soft matter such as flexible polymers, metals, or a combination of previously deposited layers such as photovoltaic device architectures known to one skilled in the art.

Pathway 200 shows the interaction of the photons 204 during photonic curing or laser sintering of the sample. As the photons 204 strike and transfer energy to the ligand-coated nanoparticles 102, heat is generated which in turn generates a plasma 205 at the surface of the sample. The incoming photons 204 are scattered by the surface plasma 205 causing them to backscatter. These backscattered photons 206 are unable to transfer energy to the nanoparticles 102 and therefore are wasted in the processing of the sample. Therefore, only a fraction of the incoming photons 204 are successful in sintering the nanoparticles 102 necessitating higher laser power and/or longer processing times. Higher laser power increases the size of the plasma 205, thereby scattering more incoming photons 204. Longer processing times allow more time for thermal spreading allowing heat to transfer throughout the film and to the substrate 101. This negates the localized sintering advantage of photonic curing or laser sintering and negates the possibility of low melting substrates 101 such as flexible polymers.

Those photons 204 that penetrate the plasma 205 are then absorbed by the ligand-coated nanoparticles 102. This absorption of photon energy produces heat which then volatilizes or decomposes the ligands or additives 103 surrounding the particles 102. The treated particles 207 are thereby left in direct contact with each other without the presence of insulating ligands. Finally the continued processing of the sample via photonic curing 300 causes the ligand-free particles 207 to sinter together into a polycrystalline film 309. However since the plasma 205 reflects much of the incoming photons 204, the heating of the nanoparticles 102 is often very non-uniform. This leads to unsintered particles 207 within the polycrystalline film 309. In addition, the volatilization of the ligands or additives 103 can cause voids 310 in the polycrystalline film 309 due to the volumetric expansion of the gases created. These two effects combine to give uneven, sometimes porous, films which are detrimental to electrical and thermal conductivity and limit the optoelectrical performance of devices.

In contrast when the sample is processed via high energy scLINAC electron beam melting 400, the electron beams 404 are transparent to plasma 205. Therefore, the electron beams 404 pass through the plasma 205 with little to no scattering. As the electron beams 404 are not scattered, they are able to fully transfer their energy to the nanoparticles 102 and sinter the sample very quickly. During processing with electron beam melting according to our invention, a tremendous amount of heat is generated with causes the ligands 103 to decompose or burn off. Since the electrons directly penetrate the nanoparticles 102 compared to absorption and conduction of heat that occurs in the photonic curing process 200, the ligand removal process occurs faster and is more complete. The treated particles 207 are thereby again left in direct contact with each other without the presence of insulating ligands 103.

Finally the continued processing of the sample with electron beams 500 causes the particles to sinter or melt together into a polycrystalline film 609 as depicted. The longer or more intense the processing, the larger the crystal boundaries become as the film anneals. For many applications, very small grain boundaries are desired as quantum confinement of semiconductor nanoparticles can be used to “tune” the bandgap and have demonstrated multi-exciton generation. In contrast to the polycrystalline film 309 produced by photonic curing or laser sintering 300, the polycrystalline film 509 produced by electron beam melting/sintering 500 is uniform thickness with little or no porosity. This leads to better electrical and thermal conductivity of the polycrystalline film 509 and better overall device performance.

While we have shown and described a currently preferred embodiment in accordance with our invention, it should be understood that the same is susceptible to further changes and modifications without departing from the scope of our invention. Therefore, we do not want to be limited to the details shown and described herein but intend to cover all such changes and modifications as are encompassed by the scope of the appended claims.

We claim:

1. An article, comprising a substrate and a suspension initially comprised of one of surfactant-coated particles and ligand-coated particles on the substrate, the particles being one of sintered and melted together on the substrate so as to be in physical contact with one another and substantially free of the surfactants or ligands removed during the sintering or melting.

2. The article of claim 1, wherein the particles being sintered or melted together are selected from the group consisting of silicon, germanium, cadmium selenide, cadmium telluride, copper indium gallium selenide (CIGS), copper indium selenide (CIS), copper sulfide, copper zinc tin sulfide (CZTS), lead sulfide, and lead selenide.

3. The article of claim 1, wherein the sintered or melted particles consist of one of semiconducting powder and semiconducting inks.

4. The article of claim 1, wherein the sintered or melted particles constitute a continuous polycrystalline film.

5. The article of claim 1, wherein the sintered or melted particles and the substrate together constitute a film.

6. The article of claim 1, wherein the particles are one of micro-, nano-, and quantum dot-particles.

* * * * *